(12) United States Patent
Lojek (10) Patent No.: US 7,335,943 B2
(45) Date of Patent: Feb. 26, 2008

(54) ULTRASCALABLE VERTICAL MOS TRANSISTOR WITH PLANAR CONTACTS

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/123,673

(22) Filed: May 6, 2005

(65) Prior Publication Data

US 2006/0249783 A1 Nov. 9, 2006

(51) Int. Cl.
*H01L 29/76* (2006.01)
(52) U.S. Cl. .............. 257/328; 257/296; 257/321; 257/324; 257/329
(58) Field of Classification Search .......... 257/328, 257/296, 331, 334
See application file for complete search history.

(56) References Cited

U.S. PATENT DOCUMENTS

| | | | |
|---|---|---|---|
| 4,774,556 A | 9/1988 | Fujii et al. ............ 357/23.5 |
| 5,395,789 A * | 3/1995 | Beitman ............... 438/424 |
| 5,780,327 A * | 7/1998 | Chu et al. ............. 438/156 |
| 5,821,591 A | 10/1998 | Krautschneider et al. ... 257/390 |
| 5,874,760 A * | 2/1999 | Burns et al. ........... 257/315 |
| 6,313,487 B1 * | 11/2001 | Kencke et al. ......... 257/192 |
| 6,580,124 B1 | 6/2003 | Cleeves et al. ........ 257/331 |
| 6,638,823 B2 * | 10/2003 | Cho et al. ............. 438/268 |
| 6,831,310 B1 | 12/2004 | Mathew et al. | |
| 2005/0098822 A1 * | 5/2005 | Mathew et al. ........ 257/314 |

\* cited by examiner

*Primary Examiner*—Evan Pert
*Assistant Examiner*—Tan Tran
(74) *Attorney, Agent, or Firm*—Schneck & Schneck; Thomas Schneck (57) ABSTRACT

A doped silicon block or island, formed above a drain electrode in substrate of a die or chip, has a height corresponding to the desired length of a channel. A source electrode is formed above the silicon island and allows for contact from above. Contact from above may also be made with an L-shaped control gate and with the subsurface drain. A horizontal array of contacts for source, gate and drain is formed for the vertical transistor that is built. If a layer of nanocrystals is incorporated into a layer between the gate and the channel, a non-volatile floating gate transistor may be formed. Without the layer of nanocrystals, an MOS or CMOS transistor is formed.

11 Claims, 9 Drawing Sheets

ULTRASCALABLE VERTICAL MOS TRANSISTOR WITH PLANAR CONTACTS

TECHNICAL FIELD

The invention relates to transistor design and construction, particularly to MOS and CMOS transistors, as well as non-volatile memory transistors.

BACKGROUND ART

There are difficulties in scaling FET and MOS transistors to ever small dimensions. These problems, related to diminished channel length, are known as "short channel effects".

Some MOS type submicron devices can be made submicron size without a problem because short channel effects are not important in some applications. On the other hand, other devices require larger channels and gates because short channel effects are very important but manufacturing rules frequently do not allow any drastic size differences, or scaling, of devices. For memory devices, for example, built in large arrays, infinite output impedance is critical for operation low power, for retaining charge, and for greater device reliability. What is needed are scalable devices, i.e., the ability to manufacture devices having channels and gates of any desired size under variable manufacturing rules.

Vertical transistor geometries are known. Such devices have a channel whose length can be adjusted. For example, U.S. Pat. No. 6,313,487 shows a transistor structure with a substrate containing a drain electrode, a source region in a silicon layer over the substrate and a channel vertically therebetween. A floating gate and a control gate overlie the channel in a spaced relation. By controlling the thickness of layers between source and drain, channel length can be controlled.

U.S. Pat. No. 6,580,124 is a device wherein a body of semiconducting material is deposited on a substrate. This is termed a "channel body" because the channel exists between vertically spaced source and drain electrodes. The device features two channels at different vertical orientations so that two charge storage regions can be formed using charge storage elements and control gates abutting the vertical channels.

One of the problems encountered in building vertical transistors is that contact must be made with lateral faces of the device, typically the gate controlling the channel. If all contacts cannot fit within the active area of the device, then valuable wafer space is lost.

An object of the invention was to devise a vertical MOS transistor with a scalable geometry with a horizontal or planar array of contacts.

SUMMARY OF INVENTION

The above object has been met with a vertical MOS transistor having a drain in a semiconductor die substrate, with a channel immediately above the drain formed by epitaxially grown silicon layers, doped with an opposite conductivity type dopant from the drain, and having a height corresponding to a desired channel length, ranging down to almost zero nanometers, if desired, without short channel effects. An epitaxially grown source, is placed above the channel and has the reverse conductivity type compared to the channel and the same as the drain. L-shaped gate regions have a vertical portion generally surrounding the channel. While the channel can be grown to any desired height, the channel can also have any desired width. The horizontal portion of the L-shaped gate extends away from the vertical channel structure and allows contact by a vertical conductive contact. Transistors of the present invention are built on silicon wafers divided by isolation regions into individual die having active region boundaries where the transistors are formed. At one portion of a die, the horizontal portion of the gate is cut back, allowing another vertical contact to reach the drain, just below the surface of the die. A third vertical contact reaches the source electrode. The three contacts are horizontally arranged in an array, although the transistor source, drain, and channel are in a stacked vertical arrangement. This allows traditional wiring schemes to be used to connect devices.

In a manufacturing method, a silicon island of a second conductivity type is built over a drain in the active area of a substrate having a first conductivity type. The height of the silicon island is selected to correspond to a desired channel length. A doped silicon source layer is deposited on top of the channel and of the first conductivity type, like the drain. L-shaped gate regions abut a thin insulative region (optionally carrying nanocrystals for non-volatile memory devices) that insulates the channel. The L-shaped gate regions have an extended horizontal portion for allowing contact from above. Another contact from above reaches the drain at a location near the source contact and a third vertical contact reaches the source thereby forming a vertical MOS transistor with an array of horizontal contacts. If nanocrystals are incorporated into the insulative matrix separating the silicon island from the gate, it is possible to build a non-volatile memory transistor.

BEST MODE FOR CARRYING OUT THE INVENTION

Figure 1:
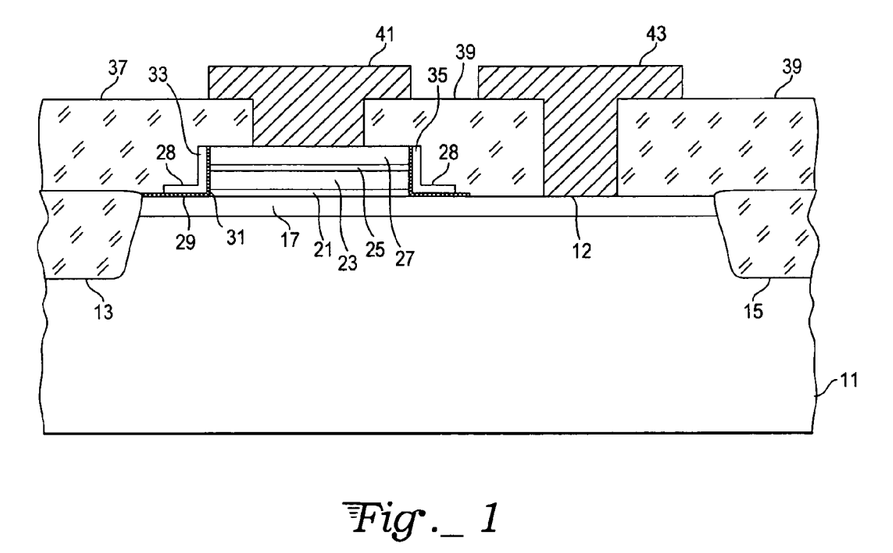
FIGS. 1 and 18 are side sectional views of transistor embodiment in accord with the present invention, with FIG. 1 taken along lines A-A in FIG. 17 and FIG. 18 taken along lines B-B in FIG. 17.

With reference to FIG. 1, a wafer substrate 11 forms a p-type substrate, or a p-well built in an n-type substrate, for the formation of an embodiment of the device of the present invention. An equivalent structure would be an n-type substrate, on an n-well in a p-type substrate, for devices of opposite conductivity type. The substrate 11 is a lightly doped p-type substrate with an active area for device formation defined by a subsurface boundary demarcated by a shallow trench isolation periphery, particularly trench areas 13 and 15 which extend a short distance below substrate surface 12.

A drain region 17 is a subsurface electrode that is highly doped n+ region that can be formed either by diffusion or ion implantation, but less deep than trench areas 13 and 15. The drain electrode most easily extends across the active area, but need not extend the total distance, so long as it extends far enough that it can be reached by a drain contact 43 which is apart from the vertically stacked arrangement of the channel and the source above the drain, described below. While a drain is shown as the subsurface electrode and the source electrode is shown at the top of a vertical electrode stack, the electrodes could be reversed and the source could be the subsurface electrode, with the drain at the top of the stack.

Above the drain 17 is a composite channel formed by p-type buffer regions 21 and 25 on either side of channel region 23, which is a p+ region. The three composite channel regions are formed by epitaxially grown undoped or lightly doped silicon, with the p-region 21 being approximately 500-800 angstroms thick, the channel region 23 being approximately 1,000 angstroms thick and the buffer region 25 being approximately 500-800 angstroms thick. The height of channel region 23 is what defines the channel length between source electrode 27 and a drain electrode 17. The width of the channel is not limited and extends into the paper. A very short channel length, say one nanometer, is theoretically possible without incurring adverse short channel effects due to buffering by channel buffer regions 21 and 25.

An n+ source region 27 is deposited above the composite channel formed by channel region 23 and buffer regions 21 and 25. The doping concentration of the source region 25 is similar to the doping concentration of drain 17 and both the source and the drain are of the same conductivity type, while the channel is of an opposite conductivity type so that source and drain p-n junctions exist between the drain and the channel and the channel and the source, typical of FET transistors. The vertically stacked sandwich arrangement of drain, channel, and source regions form a three-dimensional structure extending approximately 3,500 angstroms above the surface of the substrate and extending into the substrate by a few hundred angstroms. Such a three-dimensional transistor structure allows the channel to be scaled by dimensions as small or as large as desired for meeting circuit requirements. The channel length is defined by the thickness of layers 21, 23, and 25.

The transistor that is fabricated with the stack sandwich arrangement can be a standard MOSFET transistor, a nanocrystal memory transistor, or a CMOS transistor. In an exemplary embodiment, a nanocrystal transistor is shown by having a dielectric matrix 29 on lateral sides of the vertically stacked sandwich arrangement in an L-shaped configuration with a portion of the L being upright members abutting the channel, as well as the source, and horizontal portions parallel to the substrate and immediately above the surface 12. In an alternate embodiment, the dielectric matrix 29 would be ordinary silicon dioxide. Within the dielectric matrix 29, nanocrystals 31 are disposed by any of the usual procedures for dispersing nanocrystals in a dielectric matrix, such as chemical vapor deposition. When nanocrystals are used, the dielectric forms a charge storage area that would be appropriate for a non-volatile memory transistor. On the other hand, if nanocrystals are not dispersed in a dielectric matrix, the device can function in a common MOSFET or a CMOS transistor.

Controlling the channel are the first and second L-shaped gate members 33 and 35 on either side of the channel and adjacent to the dielectric matrix 29. The first and second L-shaped gate members are equipotential members, being joined about edges of the stacked arrangement of drain, channel, and source. The gate surrounds the channel on all sides. The horizontal portion 28 of the L-shaped gate extends away from the vertical channel structure. There is a single vertical contact to the gate members which is immediately behind the drain and so is not shown in FIG. 1, but is seen below in other figures. The gate contact is shaped identically to the drain contact with all three contacts having a vertical component extending generally parallel to the stacked arrangement of the source and channel. A source contact 41 is a metal member immediately above source 27. Drain contact 43 is a metal member which extends through the second gate insulation section 39 and makes contact with drain 17 at surface 12.

In operation, the upright portion of the gate, i.e., the upright portion of first L-shaped gate member 33 and a corresponding portion of the second L-shaped gate member 35 modulate or control current flow between source 27 and drain 17 through channel 25. Alternatively, the upright gate portion 33 and 35 can be control gates, controlling charge storage on nanocrystals 31 as charge is pulled from drain 17 onto the nanocrystals by tunneling action, or otherwise, as controlled by voltages on upright portions of the gates 33 and 35. If dielectric matrix 29 is used for supporting nanocrystals, a supplemental thin oxide coating, known as tunneling oxide may be disposed on the stacked sandwich arrangement of source and channel so that the dielectric matrix 29 supporting nanocrystals 31 could be made very thin. If a memory device is not constructed, the typical thickness for dielectric matrix 29 would be typically 20-50 angstroms.

Figure 2:
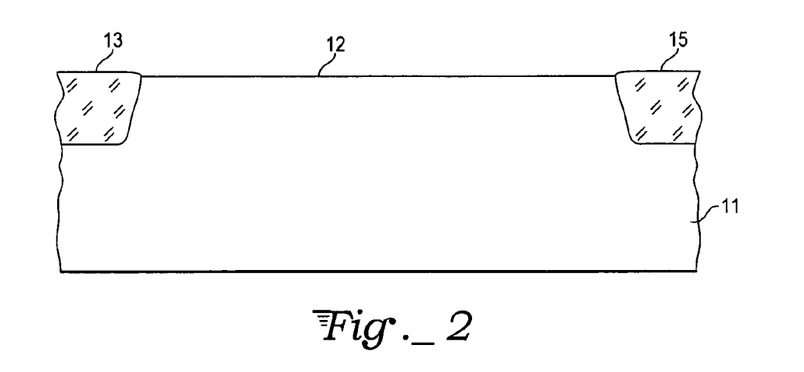
FIGS. 2-6, 8, 9, 11-14, and 16 are side sectional views of the device of FIG. 1 at different stages of construction.

Construction of the device of FIG. 1 may be seen with reference to FIG. 2. Substrate 11 is lightly doped silicon, a portion of a standard silicon wafer having shallow trench isolation (STI) regions 13 and 15 which define an active area for construction of a vertical MOS transistor. A typical area-wise dimension is under 90,000 square nanometers if built with 90 nm technology. Such an area is insufficient for building a conventional MOS transistor with channel dimension adequate for avoiding undesired short channel effects. On the other hand, a vertical transistor, with a vertical channel, will easily fit in this space, with a channel scaled to be appropriate for the purpose of the transistor and yet have contacts similar in geometry to contacts for a lateral transistor.

Figure 3:
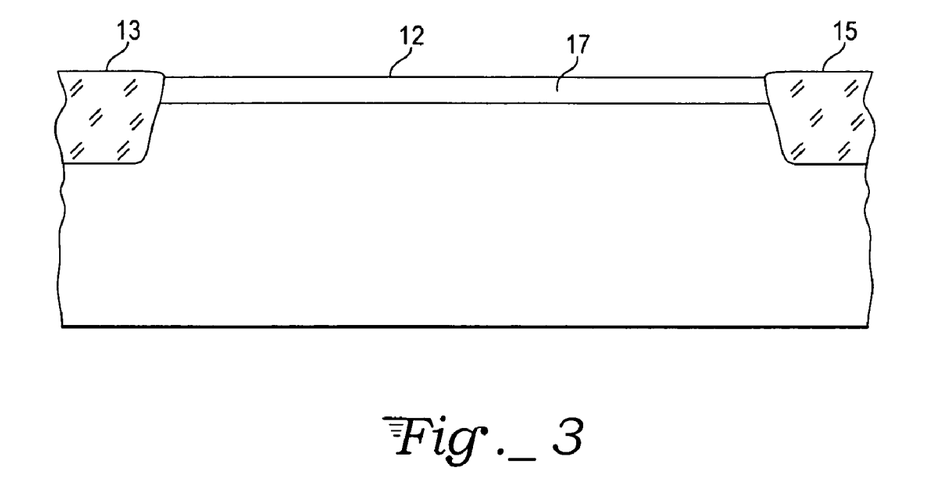

With reference to FIG. 3, a doped region 17 forms a drain spanning the space between isolation regions 13 and 15 below surface 12. Doping may be by diffusion or ion implantation. The thickness of the doped drain region 17 is not critical, and is approximately 400-600 angstroms thick and is a highly doped region, typically an n+ region where substrate 11 is p-type. Of course, polarities could be reversed.

Figure 4:
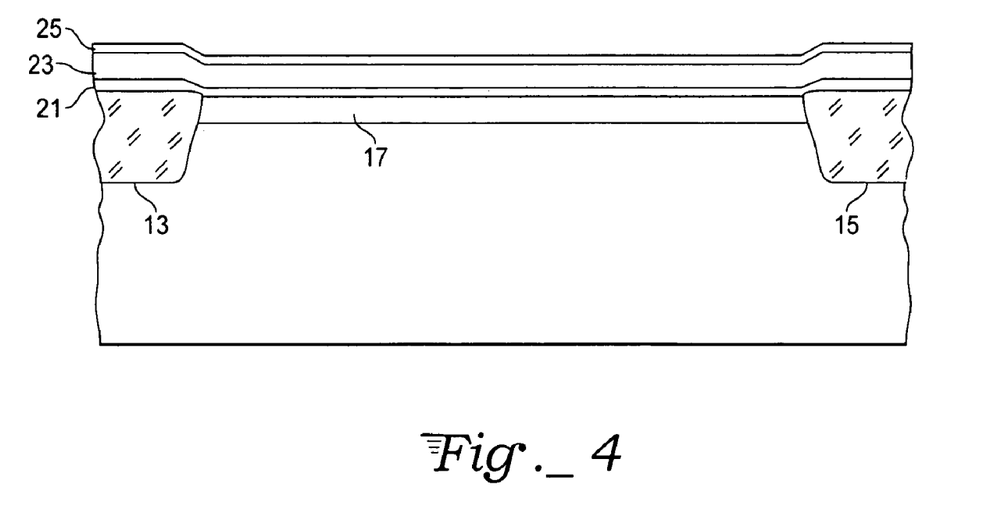

In FIG. 4, three epitaxial silicon layers are grown over the subsurface drain region 17. These layers have a conductivity type opposite that of the drain, p-type in this example. The lowermost and uppermost of the three layers are buffer layers for a channel layer which resides between the lowermost and uppermost layers 21 and 25. The lowermost layer 21 and uppermost layer 25 of the three epitaxial layers are each approximately 500-800 angstroms thick and are lightly doped or undoped. The height of the channel region 23 defines the channel length. This length may be adjusted vertically to be very small or very large and several different devices can be scaled with approximately the same geometry. In this example, nanocrystal transistors are described for use as non-volatile memory devices. FET and CMOS transistors could be built using the same geometry, without nanocrystals.

Figure 5:
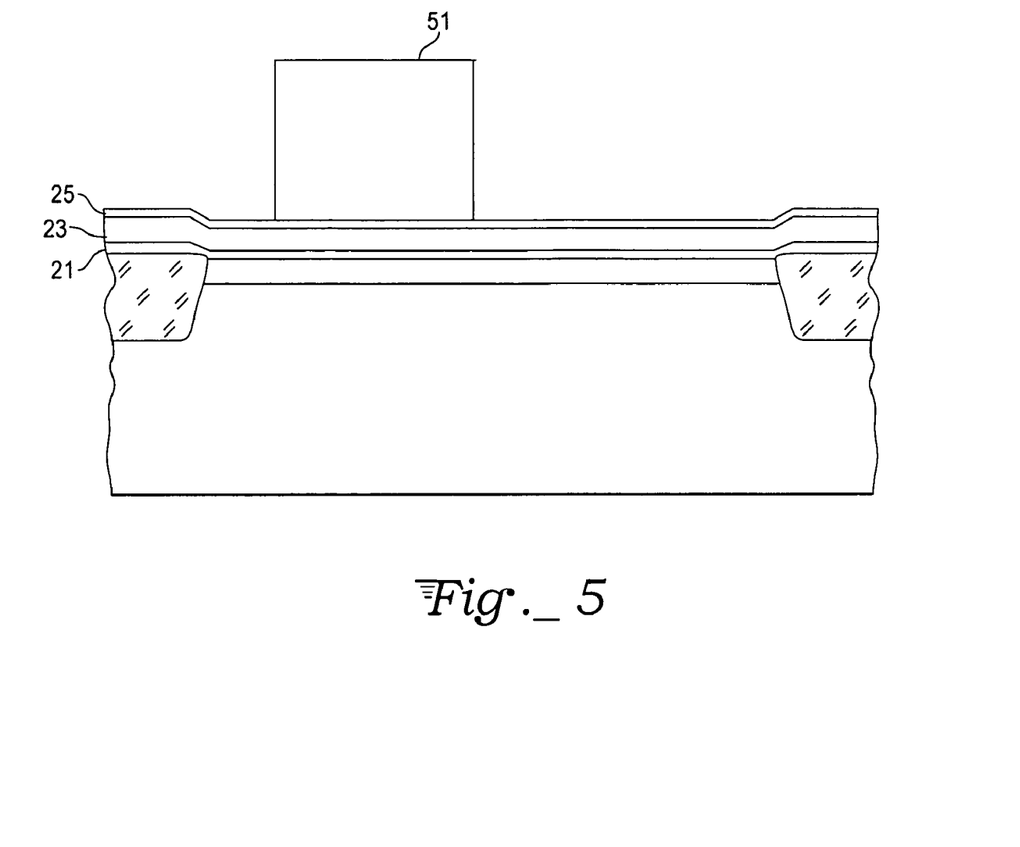

With reference to FIG. 5, mask 51 defines the cross sectional dimensions of the channel to be formed by the three epitaxial silicon layers 21, 23, and 25. Recall that the length of the channel is defined by the height of layer 23, but the cross sectional area or widths of the channel is defined by mask 51.

Figure 6:
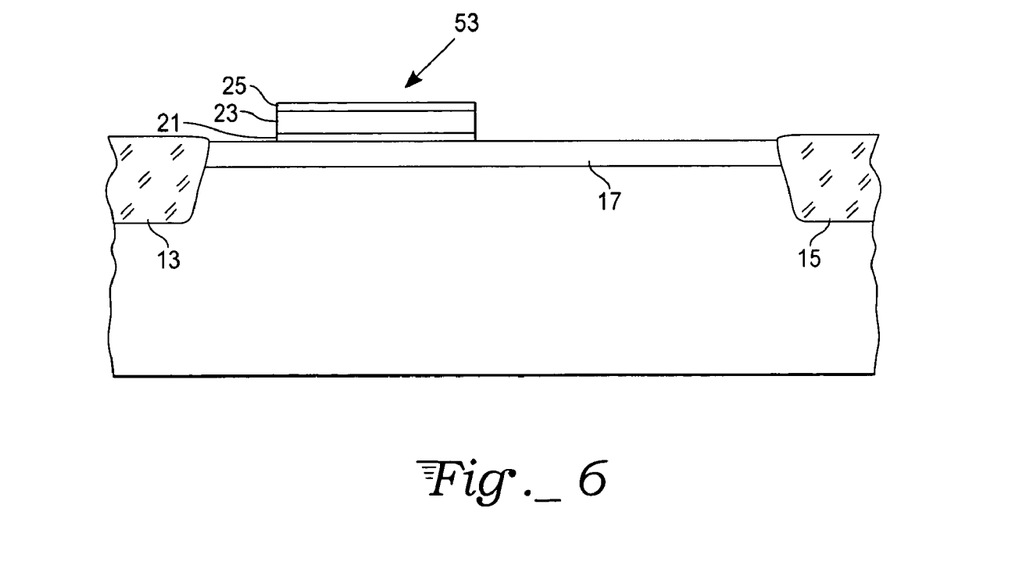

In FIG. 6, the non-protected portions of the epitaxial layers 21, 23, and 25 have been removed and the mask itself has been removed, leaving a silicon island 53 atop drain 17 between the isolation regions 13 and 15.

Figure 7:
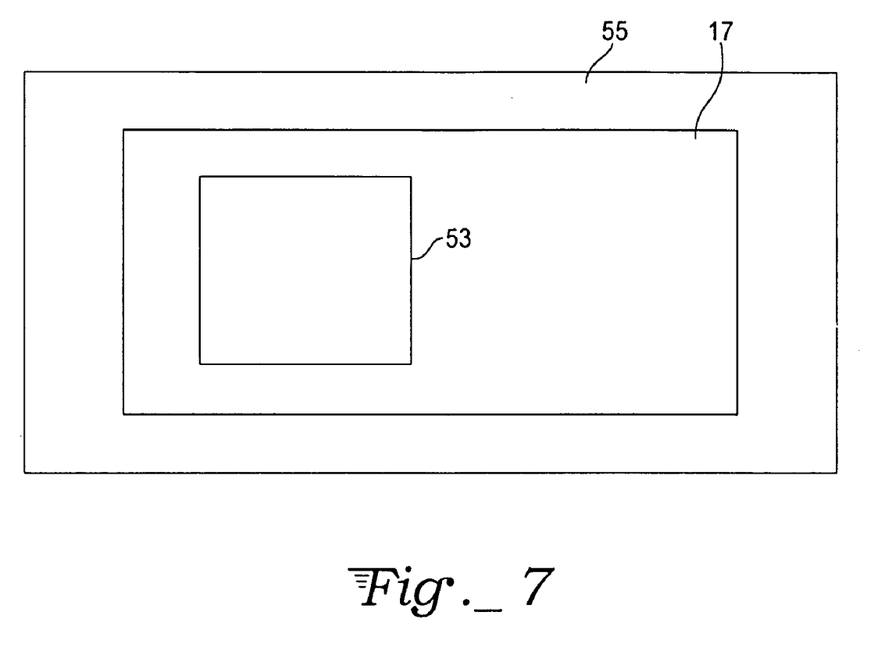
FIGS. 7, 10, 15, and 17 are top plan views of the device of FIG. 1 and FIG. 18 with FIG. 7 corresponding to FIG. 6, FIG. 10 corresponding to FIG. 9, FIG. 15 corresponding to FIG. 14, and FIG. 17 corresponding to FIG. 16.

In the top view of FIG. 7, isolation perimeter 55, where shallow trench isolation portions 13 and 15 reside, surrounds the active area where drain 17 resides over the entirety of the active area. The silicon island 53 is offset from the center of the active area and will have further layers deposited thereon.

Figure 8:
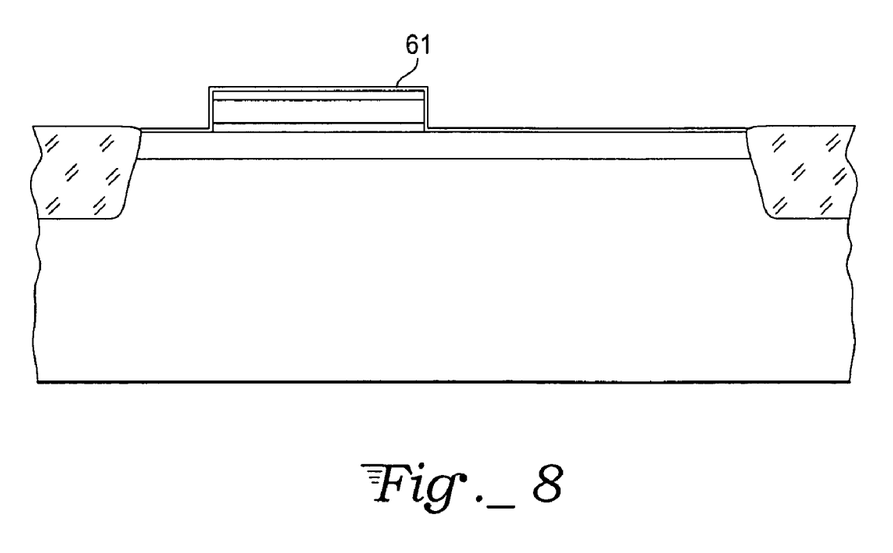

In FIG. 8, a thin dielectric layer 61, such as a thin high quality gate oxide, approximately 20-50 angstroms thick, is thermally grown over the surface of the layer. In an embodiment involving nanocrystals, silicon nanocrystals will be dispersed on the oxide layer or in a dielectric matrix on the thin oxide layer by the usual techniques, such as chemical vapor deposition. The deposition of nanocrystal layers is extensively described in technical literature.

Figure 9:
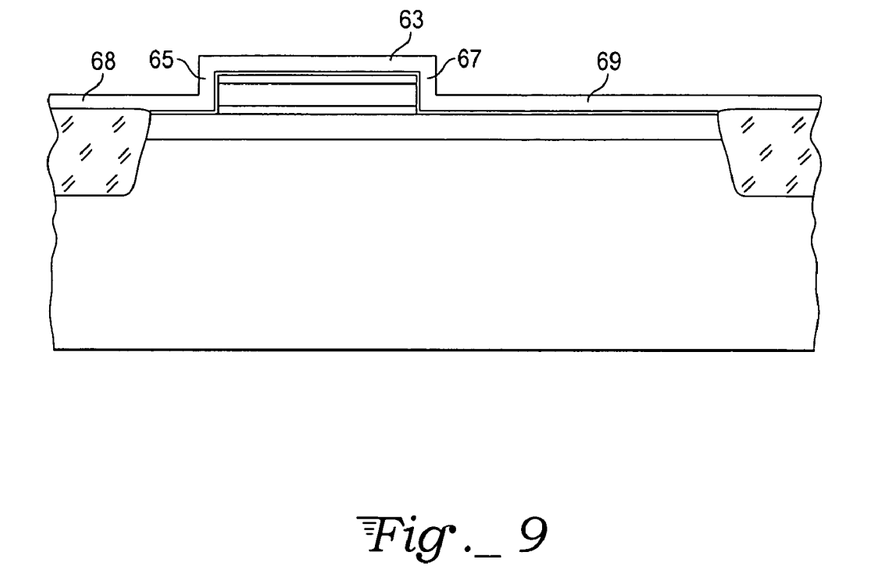

In FIG. 9, a polysilicon layer 63 is deposited over the entirety of the substrate covering the silicon island 53 with vertical sidewalls 65 and 67, as well as horizontal portions 68 and 69 proximate to the subsurface drain 17.

Figure 10:
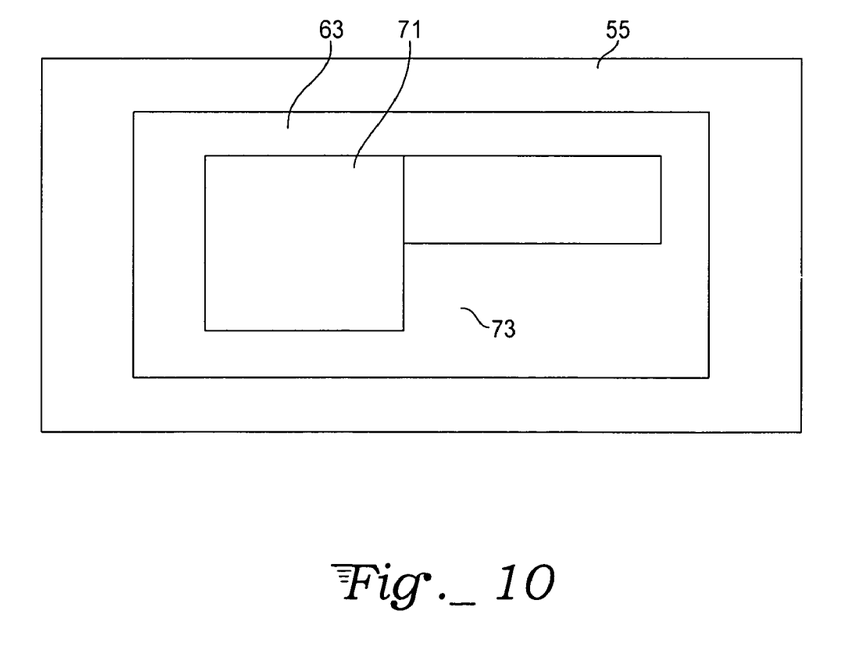

In FIG. 10, a flag-shaped mask 71 is placed within the boundary of the polysilicon gate 63 which was shown to be deposited in FIG. 9. The mask does not protect quadrant 73 of the die or chip, but protects other quadrants. Note that the rectangular border 55 represents the isolation parameter of the die or chip, (i.e., active area).

Figure 11:
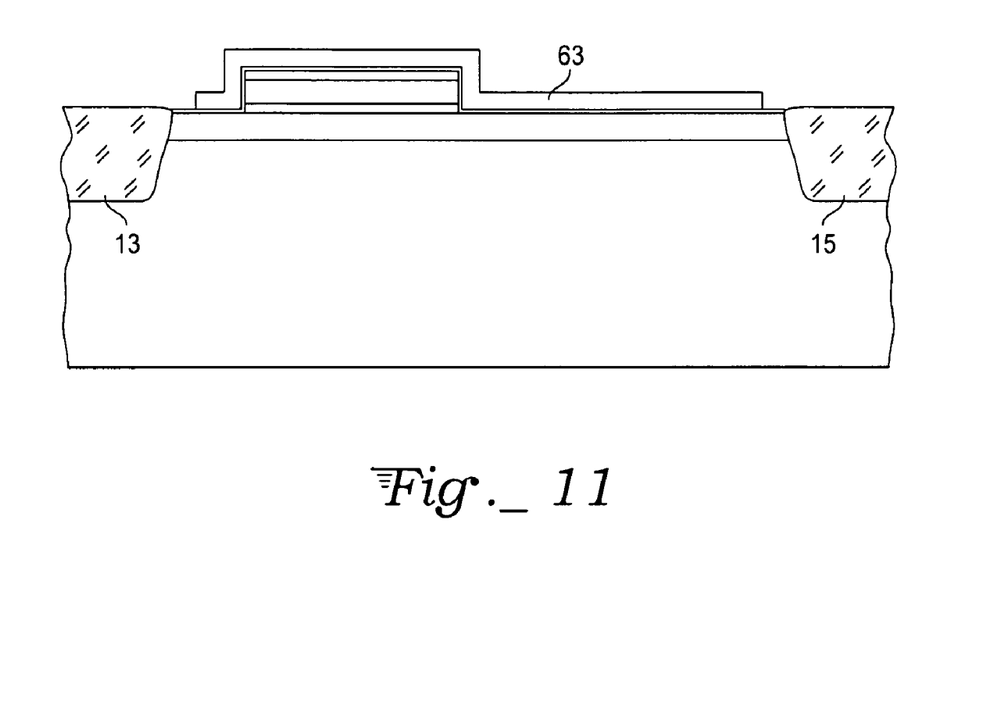

In FIG. 11, the polysilicon layer 63 is seen to be trimmed by removal of polysilicon over the isolation areas 13 and 15.

Figure 12:
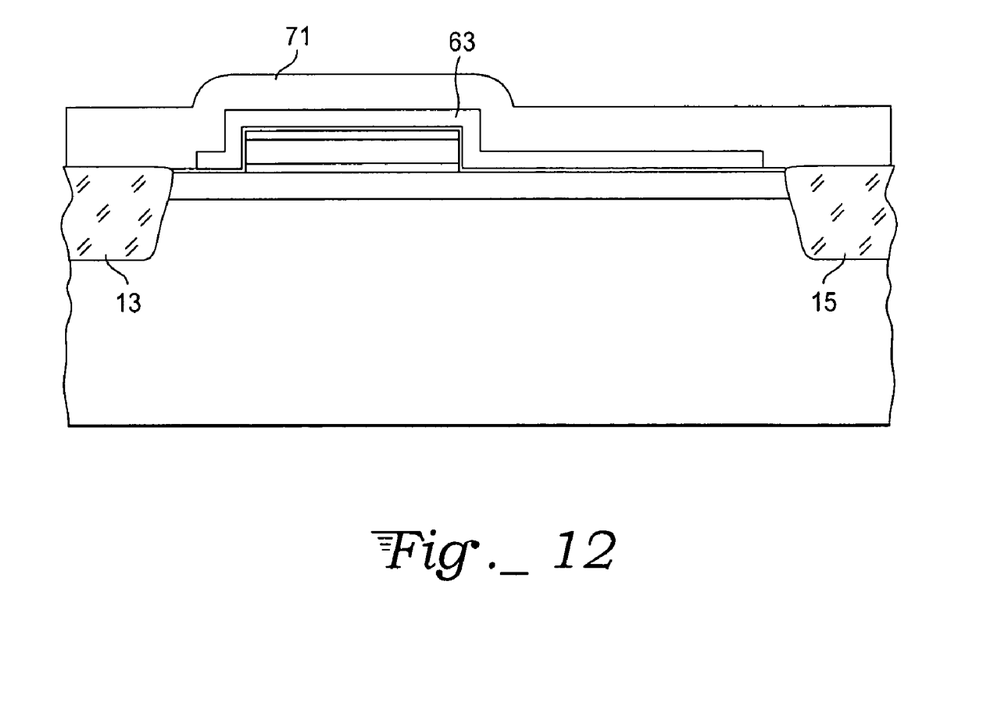
Figure 13:
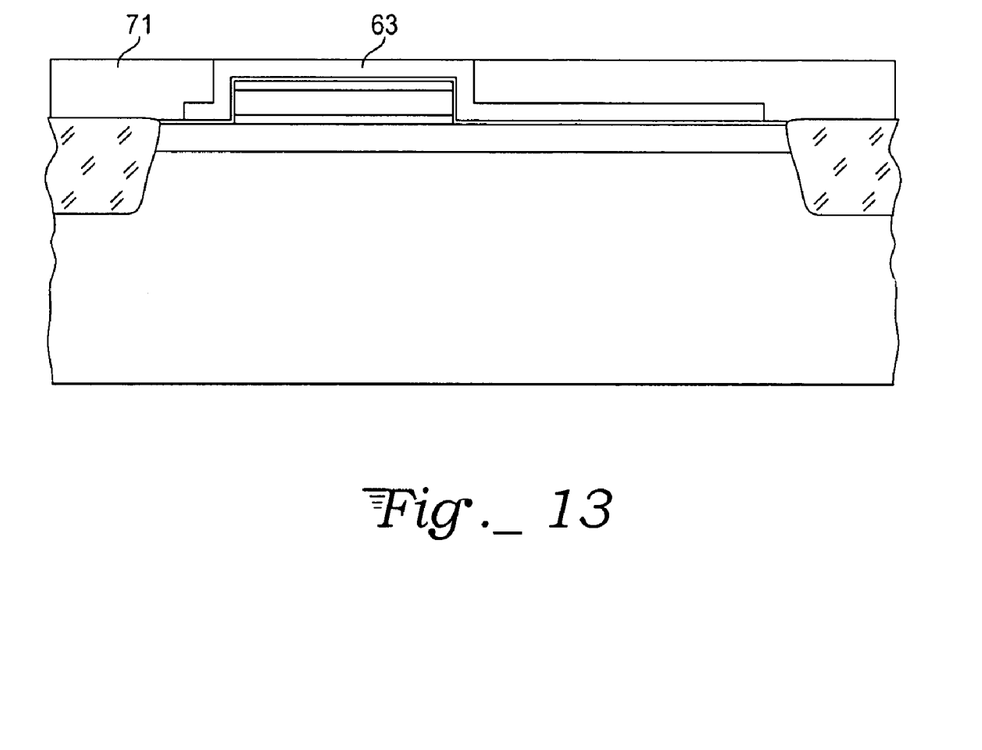

In FIG. 12, a nitride layer 71 is deposited over the trimmed polysilicon layer 63 in a manner extending over the entire die. This layer is now leveled by chemical-mechanical polishing (CMP), stopping on the polysilicon layer, as shown in FIG. 13.

Figure 14:
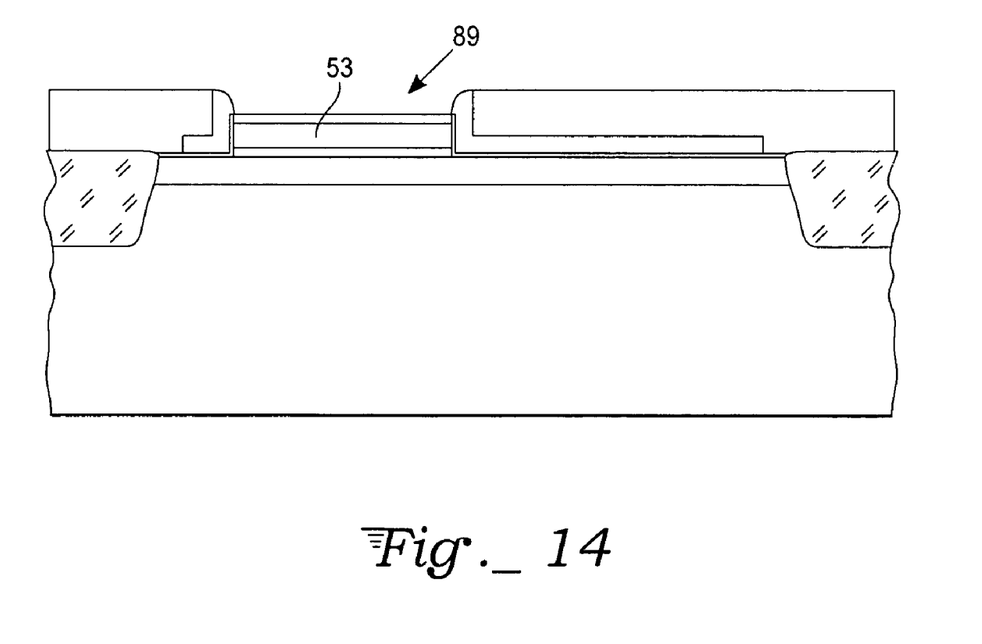
Figure 15:
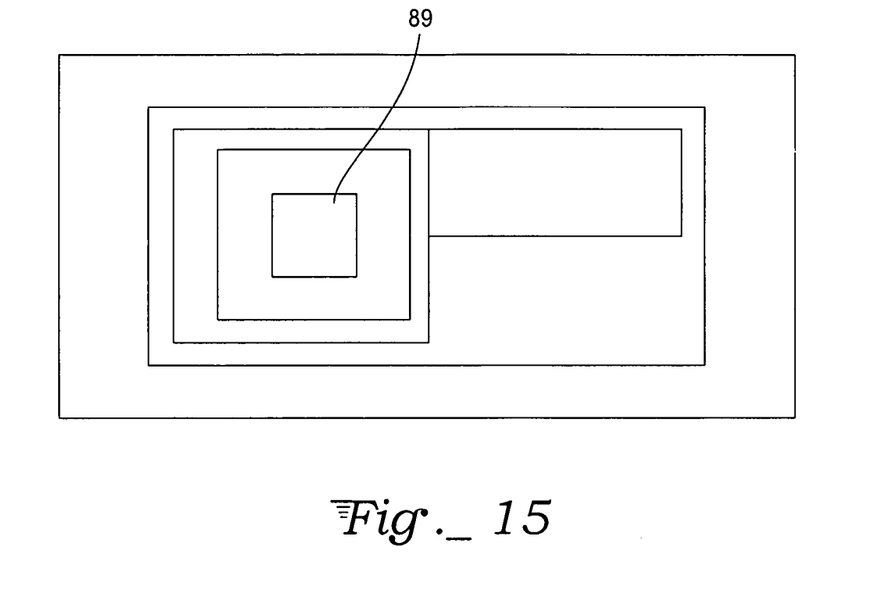

In the next step, the upper region of polysilicon, as well as a portion of gate insulator 61, will be removed in a rectangular configuration opening a window 89 to the silicon island 53, as seen in FIGS. 14 and 15. The window 89 allows growth of an epitaxial doped silicon layer 81 above the silicon island 53, seen in FIG. 16. The doping of layer 81 is of a second conductivity type, approximately at the same concentration as drain 17 and in the same polarity type for the majority carriers, i.e., n+ type.

Figure 16:
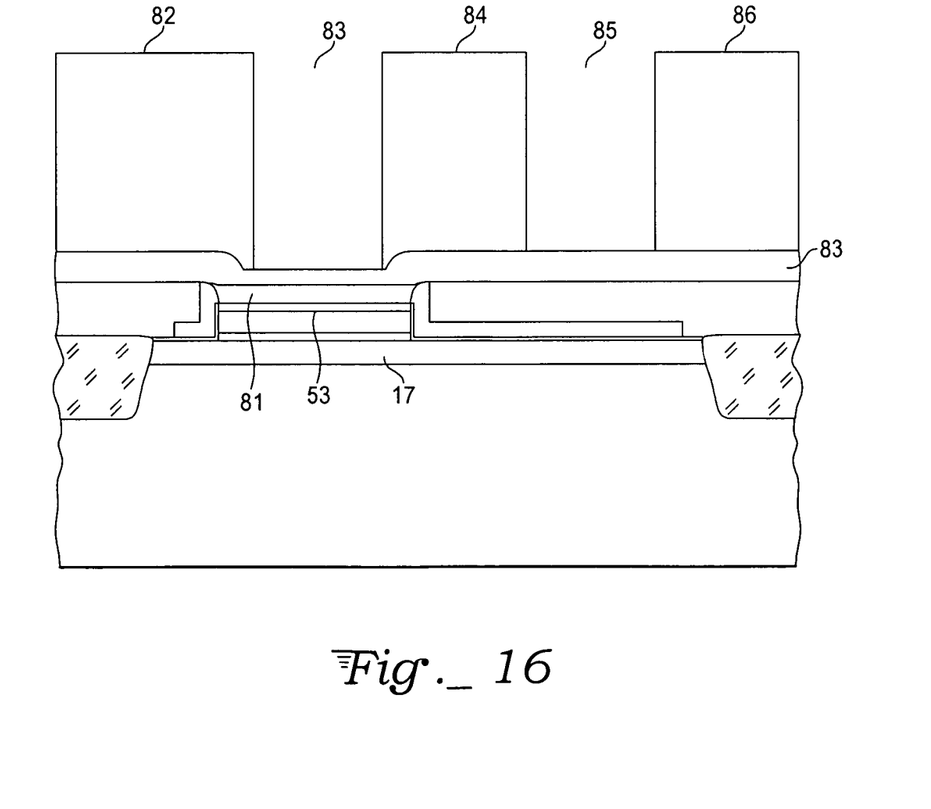
Figure 17:
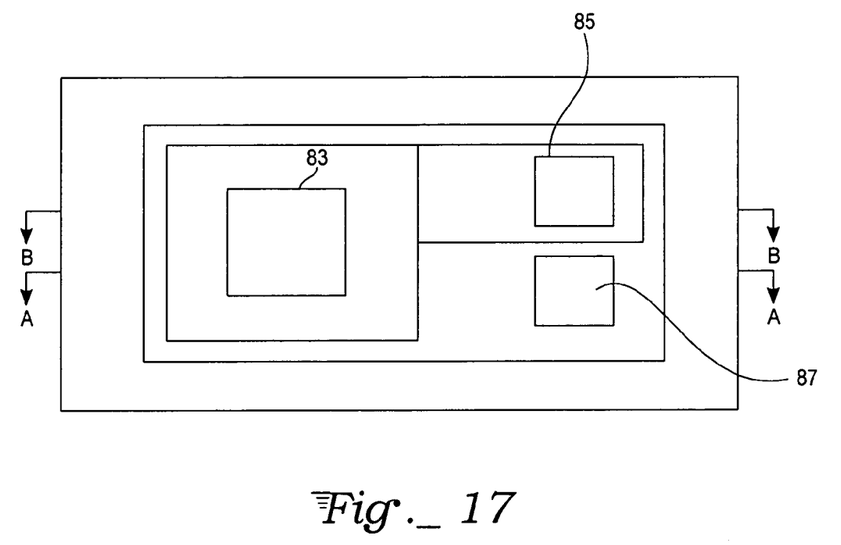
Figure 18:
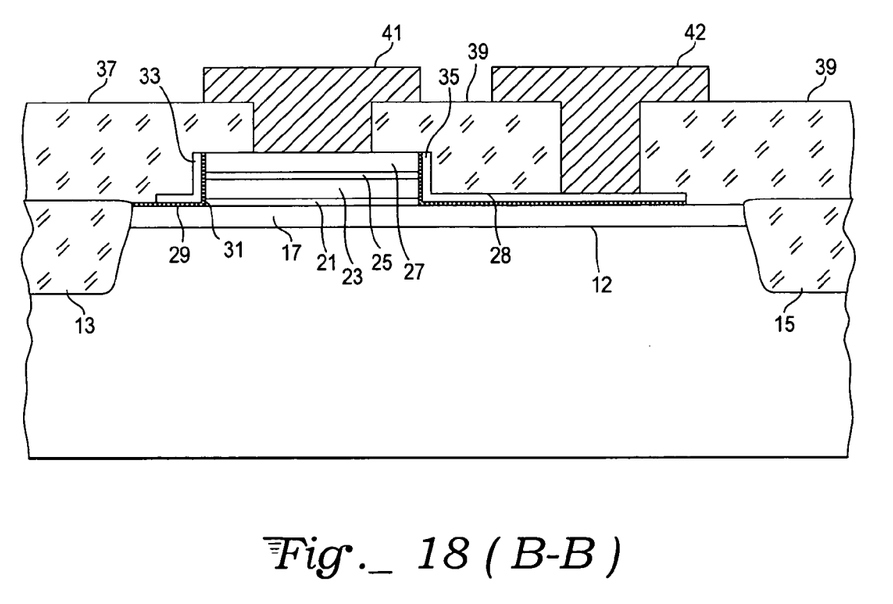

After deposition and etching of this source layer, a nitride layer 83, seen in FIG. 16, is deposited and etched to the shape shown. Mask members 82, 84, and 86 are placed over the nitride layer 81 or oxide (TEOS) layer to define a source contact 83, as well as a drain contact opening 85, and a gate contact opening, not seen in FIG. 16, but seen in the top view of FIG. 17. In FIG. 17, source contact opening 83 extends to the top of the most recently deposited source electrode. Opening 85 extends to the top of a polysilicon L-shaped gate electrode and contact opening 87 extends to the top of the substrate where contact is made with the drain electrode. When the three openings are filled with metal, then etched, resulting structure appears like FIG. 1 and FIG. 18. In FIG. 18, contact 42 reaches the extension 28 of gate electrode 35. It can be seen that the three contacts 83, 85, and 87 form a planar array for source, gate, and drain electrodes which are arranged in a vertical array.

What is claimed is:

1. A vertical MOS transistor comprising:
   a vertically stacked sandwich arrangement of drain, channel, and source regions with a top and bottom on a lightly doped silicon substrate within an active area defined by isolation regions in the substrate wherein one of the source and drain regions is at least partially in the substrate with a first extension at the bottom of the sandwich arrangement and extending away from the stacked sandwich arrangement and having a first conductivity type, the channel having a second conductivity type and the other of the source and drain regions at the top of the sandwich arrangement having the first conductivity type;
   an L-shaped gate with upright portions laterally adjacent to said stacked sandwich arrangement but separated by thin insulation, the gate having a non-upright portion forming a second extension away from the stacked sandwich arrangement and separated from the first extension by said thin insulation; and
   a plurality of electrical contacts with first and second contacts having vertical portions contacting said first and second extensions and a third contact contacting the region at the top of the sandwich arrangement, the first, second, and third contacts having portions arranged in a planar array.

2. The device of claim 1 further comprising a nanocrystal layer associated with the thin insulation between the channel and upright portions of the gate.

3. The device of claim 1 wherein the second extension of the gate has a first portion with a first length extending away from the channel and a second portion with a second length shorter than the first length.

4. The device of claim 1 wherein the channel is a second epitaxial layer of silicon between first and third epitaxial layers of silicon, the first and third epitaxial layers serving as buffers.

5. The device of claim 1 wherein said drain is completely in the substrate throughout the active area.

6. A vertical MOS transistor comprising:
   a semiconductor substrate defining an active region and having an upper surface, the active area forming the device footprint;
   a doped drain region of a first conductivity type immediately below the upper surface of the substrate extending across the active area;
   a block of channel material of a second conductivity type over the doped drain region above the substrate;
   an L-shaped conductive gate spaced from the block of channel material by a dielectric layer having an upright portion proximate the channel material and having a lateral portion parallel to the substrate;
   a doped layer of the first conductivity type atop the block of channel material;
   a source contact having a vertical portion contacting the doped layer of the first conductivity atop the block of channel material;
   a drain contact having a vertical portion spaced apart from the L-shaped conductivity gate and contacting the doped drain region at the surface of the substrate; and
   a gate contact having a vertical portion contacting the lateral portion of the L-shaped gate parallel to the substrate wherein the vertical portion of the source, gate, and drain contacts are all within the active area.

7. The device of claim 1 wherein the dielectric layer separating the L-shaped conductivity gate from the block of channel material contains nanocrystals.

8. A vertical MOS memory transistor manufactured on a wafer substrate comprising:
   an active area of a lightly doped semiconductor substrate having a vertically stacked sandwich arrangement of drain, channel and source semiconductor regions with a top and bottom, a bottom of the drain region extending completely over the active area;

a charge storage layer having nanocrystals in a dielectric matrix and having an upright portion laterally adjacent to said stacked sandwich arrangement but separated by thin insulation, the charge storage layer having a non-upright portion forming a charge storage layer extension away from the stacked sandwich arrangement partially covering the bottom region that extends completely over the active area;

an insulative layer over the stacked sandwich structure and the active area having three openings for three contacts forming a planar array for source, gate and drain contacts, the three contacts extending in the vertical direction.

9. The apparatus of claim 8, wherein a first of the three contacts makes contact with the top of vertically stacked sandwich.

10. The apparatus of claim 9 wherein a second of the three contacts makes contact with the gate extension away from the stacked sandwich.

11. The apparatus of claim 10 wherein a third of the three contacts makes contact with the bottom region of the vertically stacked sandwich at a region where the bottom region is not covered by the charge storage layer extension.

* * * * *